(12) United States Patent
Li et al.

(10) Patent No.: US 8,798,945 B2
(45) Date of Patent: Aug. 5, 2014

(54) COMPUTING DEVICE AND METHOD FOR TESTING CHARGING AND DISCHARGING RELIABILITY OF RECHARGABLE BATTERY

(75) Inventors: Shen-Chun Li, New Taipei (TW); Hsien-Chuan Liang, New Taipei (TW); Shou-Kuo Hsu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 368 days.

(21) Appl. No.: 13/241,272

(22) Filed: Sep. 23, 2011

(65) Prior Publication Data

US 2012/0185189 A1    Jul. 19, 2012

(30) Foreign Application Priority Data

Jan. 17, 2011   (TW) .............................. 100101576 A

(51) Int. Cl.
*G01R 31/36* (2006.01)
*H02J 7/00* (2006.01)

(52) U.S. Cl.
USPC ............................................ 702/63; 320/136

(58) Field of Classification Search
USPC ............... 702/63, 57, 60, 64–65, 81, 84, 108, 702/123, 127, 182–183, 189; 320/127–128, 320/135–137, 152, 162; 324/427, 430, 324/432–433; 429/428, 430–432; 703/4, 703/13, 18
See application file for complete search history.

(56) References Cited

FOREIGN PATENT DOCUMENTS

CN    101542821 A    9/2009

OTHER PUBLICATIONS

Chen et al., Accurate Electrical Battery Model Capable of Predicting Runtime and I-V Performance, Jun. 2006, IEEE Transactions on Energy Conversion, vol. 21, No. 2, pp. 504-511.*

* cited by examiner

*Primary Examiner* — Toan Le
(74) *Attorney, Agent, or Firm* — Novak Druce Connolly Bove + Quigg LLP

(57) ABSTRACT

In a method for testing the charging and discharging reliability of a rechargeable battery, a test device measures the battery to obtain first terminal voltages and first electric currents when the battery is charged by a power supply. After the battery is discharged, the test device measures the battery to obtain second terminal voltages and second electronic currents. Based on the first terminal voltages and the first electric currents, a first lifecycle curve can be created. Based on the second terminal voltages and the second electric currents, a second lifecycle curve is created. The method compares the first lifecycle curve with a charging lifecycle curve, compares the second lifecycle curve with a discharging lifecycle curve, and generates a lifecycle estimation report of the rechargeable battery according to the comparison results.

18 Claims, 3 Drawing Sheets

COMPUTING DEVICE AND METHOD FOR TESTING CHARGING AND DISCHARGING RELIABILITY OF RECHARGABLE BATTERY

BACKGROUND

1. Technical Field

Embodiments of the present disclosure generally relate to testing computing devices, and more particularly to a computing device and a method for testing charging and discharging reliability of a rechargeable battery.

2. Description of Related Art

Methods of testing rechargeable batteries have some disadvantages. Some methods require the rechargeable battery to be manually measured after the rechargeable battery is charged or discharged by a power supply, where measured data is compared from the rechargeable battery with critical values, to determine the lifetime of the rechargeable battery. Other methods require a particular device to test the lifetime of the rechargeable battery. However, manually measurement and comparison is inefficient, and the particular device is costly. Therefore, a more economical and efficient method for testing a rechargeable battery is desired.

DETAILED DESCRIPTION

In general, the term "module," as used herein, refers to logic embodied in hardware or firmware, or to a collection of software instructions, written in a programming language, such as, for example, Java, C, or assembly. One or more software instructions in the modules may be embedded in firmware, such as in an EPROM. It will be appreciated that modules may comprise connected logic units, such as gates and flip-flops, and may comprise programmable units, such as programmable gate arrays or processors. The modules described herein may be implemented as either software and/or hardware modules and may be stored in any type of non-transitory computer-readable medium or other computer storage device.

Figure 1:
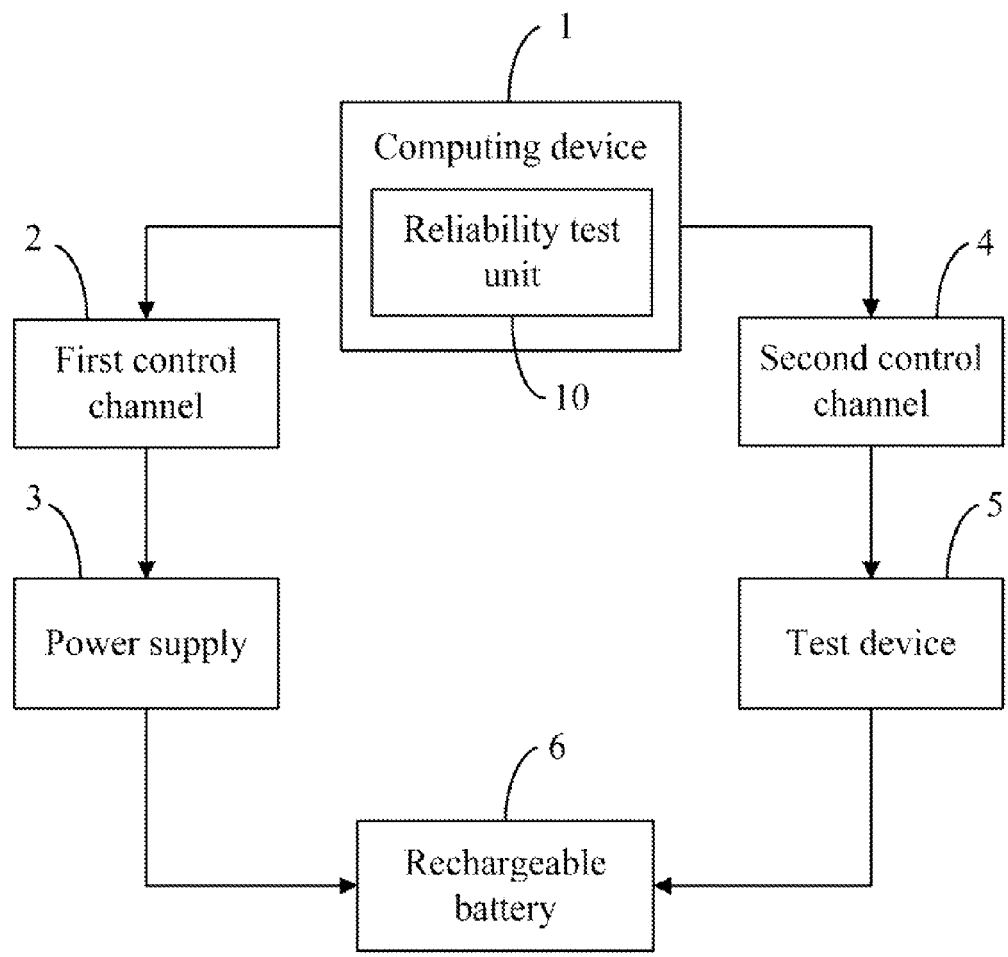
FIG. 1 is a block diagram of one embodiment of a computing device communicating with a rechargeable battery.

FIG. 1 is a block diagram of one embodiment of a computing device 1 for testing a rechargeable battery 6. In the embodiment, the computing device 1 electronically connects to a power supply 3 via a first control channel 2, and electronically connects to a test device 5 via a second control channel 4. The computing device 1 includes a reliability test unit 10, which controls the power supply 3 to charge or discharge the rechargeable battery 6, controls the test device 5 to measure terminal voltages and electric currents of the rechargeable battery 6 when the rechargeable battery 6 is charged and discharged, and creates lifecycle curves of the rechargeable battery 6 based on the terminal voltages and the electric currents. By comparing the lifecycle curves with predetermined life curves, the reliability test unit 10 performs a lifecycle estimation on the rechargeable battery 6, and displays a lifecycle estimation report on a display screen 14 (shown in FIG. 2) of the computing device 1. Detail functions of the reliability test unit 10 are described, in reference to FIG. 2, below.

Figure 2:
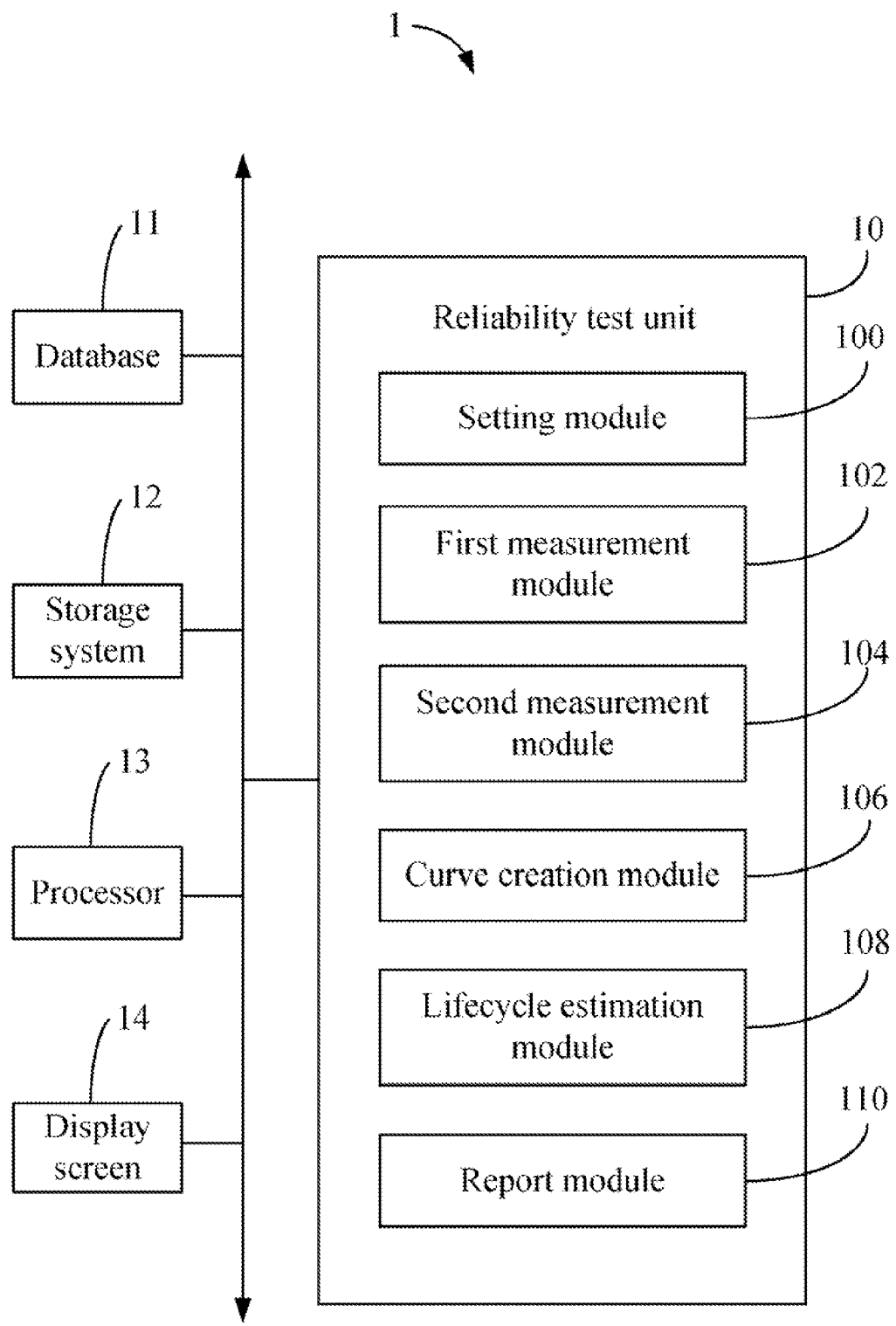
FIG. 2 is a block diagram of one embodiment of the computing device of FIG. 1 including a reliability test unit.

FIG. 2 is block diagram of one embodiment of the computing device 1 including the reliability test unit 10. In one embodiment, the computing device 1 may be an electronic device (e.g., a computer) that includes at least one processor 13. The unit 10 may comprise computerized code in the form of one or more programs that are stored in a storage system 12, and executed by the processor 13.

In one embodiment, the storage system 12 may be a magnetic or an optical storage system, such as a hard disk drive, an optical drive, a compact disc, a digital video disc, a tape drive, or other suitable storage medium.

The computing device 1 further includes a database 11, which is used for storing the terminal voltages and the electric currents of the rechargeable battery 6 measured by the test device 5.

In one embodiment, the reliability test unit 10 includes a setting module 100, a first measurement module 102, a second measurement module 104, a curve creation module 106, a lifecycle estimation module 108, and a report module 110. Each of the modules 100-110 may be a software program including one or more computerized instructions that are stored in the storage system 12 and executed by the processor 13. The processor 13 may be a central processing unit or a math coprocessor, for example.

The setting module 100 sets a first working parameter of the power supply 3 in relation to charging of the rechargeable battery 6, and a second working parameter of the power supply 3 in relation to discharging of the rechargeable battery 6. In detail, the first working parameter may include a charge time, measurement times for measuring the terminal voltages and the electric currents of the rechargeable battery 6, a driving voltage, a driving impedance, and a protection current during the charging of the rechargeable battery 6. The second working parameter may include a discharge time, measurement times for measuring the terminal voltages and the electric currents of the rechargeable battery 6, a load voltage, a load impedance, and a protection current during the discharging of the rechargeable battery 6.

In the embodiment, the driving voltage can be adjusted, while the load voltage is a fixed value. The protection currents protect the power supply 3 from damage when the power supply 3 charges or discharges the rechargeable battery 6.

The first measurement module 102 controls the power supply 3 to charge the rechargeable battery 6 according to the first working parameter, controls the test device 5 to measure the rechargeable battery 6 a number of times when the rechargeable battery 6 is charged, and obtains a first plurality of terminal voltages and a first plurality of electric currents of the rechargeable battery 6. In the embodiment, the number of times can be user-determined. The first measurement module 102 further records the first terminal voltages and the first electric currents in the database 11.

The second measurement module 104 controls the power supply 3 to discharge the rechargeable battery 6 according to the second working parameter, controls the test device 5 to measure the rechargeable battery 6 a number of times when the rechargeable battery 6 is discharged, and obtains a second plurality of terminal voltages and a second plurality of electronic currents of the rechargeable battery 6. In the embodiment, the number of times can be determined according to user requirements. The second measurement module 102 further records the second terminal voltages and the second electric currents in the database 11.

The curve creation module 106 creates a first lifecycle curve based on the first terminal voltages and the first electric currents, and creates a second lifecycle curve based on the second terminal voltages and the second electric currents.

The lifecycle estimation module 108 compares the first lifecycle curve with a predetermined charging lifecycle curve, and compares the second lifecycle curve with a predetermined discharging lifecycle curve.

The report module 110 generates a lifecycle estimation report of the rechargeable battery 6 according to the comparison results, and displays the lifecycle estimation report on the display screen 14.

In one embodiment, if the first lifecycle curve closely meets the charging lifecycle curve, and the second lifecycle curve closely meets the discharging lifecycle curve, the report module 110 reports that the rechargeable battery 6 has a long lifecycle. If the first lifecycle curve does not closely meet the charging lifecycle curve, or the second lifecycle curve does not closely meet the discharging lifecycle curve, the report module 110 reports that the rechargeable battery 6 has a short lifecycle.

In the embodiment, the lifecycle estimation report 110 indicates the charging and discharging reliability of the rechargeable battery 6.

Figure 3:
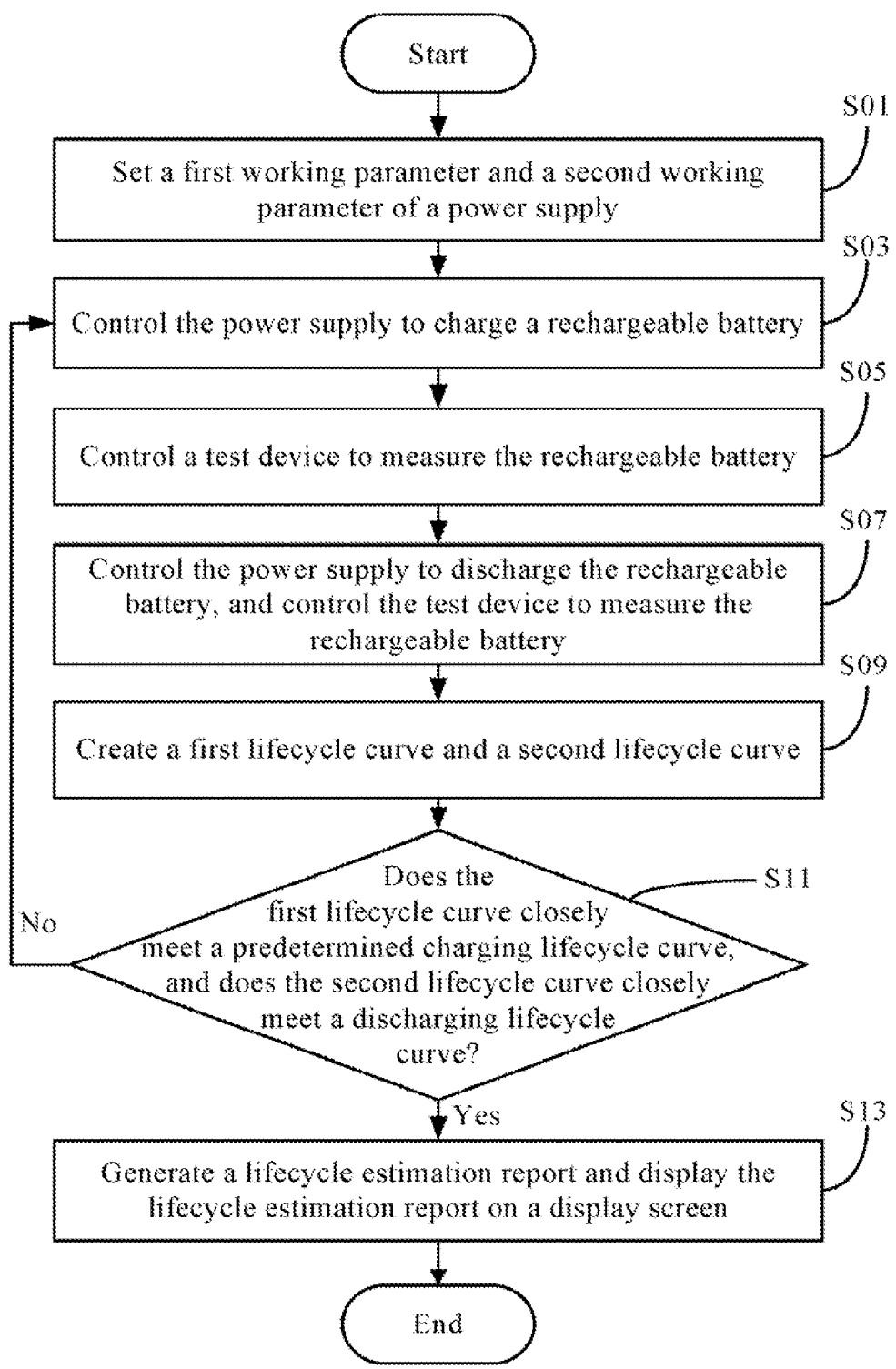
FIG. 3 is a flowchart illustrating one embodiment of a method for testing reliability of charging and discharging a rechargeable battery using the computing device of FIG. 2.

FIG. 3 is a flowchart illustrating one embodiment of a method for testing charging and discharging reliability of a rechargeable battery 6 by using the computing device 1 of FIG. 2. Depending on the embodiment, in FIG. 3, additional blocks may be added, others removed, and the ordering of the blocks may be changed.

In block S01, the setting module 100 sets a first working parameter of the power supply 3 in relation to charging of the rechargeable battery 6, and a second working parameter of the power supply 3 in relation to discharging of the rechargeable battery 6.

In block S03, the first measurement module 102 controls the power supply 3 to charge the rechargeable battery 6 according to the first working parameter. In one embodiment, the first working parameter may include a charge time, measurement times for measuring the terminal voltages and the electric currents of the rechargeable battery 6, a driving voltage, a driving impedance, and a protection current during the charging of the rechargeable battery 6. In the embodiment, the protection currents protect the power supply 3 from damage when the power supply 3 charges the rechargeable battery 6.

In block S05, the first measurement module 102 controls the test device 5 to measure the rechargeable battery 6 a number of times when the rechargeable battery 6 is charged, and obtains a first plurality of terminal voltages and a first plurality of electric currents of the rechargeable battery 6. The first measurement module 102 records the first terminal voltages and the first electric currents in the database 11.

In block S07, the second measurement module 104 controls the power supply 3 to discharge the rechargeable battery 6 according to the second working parameter, controls the test device 5 to measure the rechargeable battery 6 a number of times when the rechargeable battery 6 is discharged, and obtains a second plurality of terminal voltages and a second plurality of electronic currents of the rechargeable battery 6. The second measurement module 102 further records the second terminal voltages and the second electric currents in the database 11.

In one embodiment, the second working parameter may include a discharge time, measurement times for measuring the terminal voltages and the electric currents of the rechargeable battery 6, a load voltage, a load impedance, and a protection current during the discharging of the rechargeable battery 6. The load voltage is a fixed value, and cannot be adjusted.

In block S09, the curve creation module 106 creates a first lifecycle curve based on the first terminal voltages and the first electric currents, and creates a second lifecycle curve based on the second terminal voltages and the second electric currents. In the embodiment, the first lifecycle curve and the second lifecycle curve are current-voltage characteristics.

In block S11, the lifecycle estimation module 108 compares the first lifecycle curve with a predetermined charging lifecycle curve, and compares the second lifecycle curve with a predetermined discharging lifecycle curve. If the first lifecycle curve closely meets the charging lifecycle curve, and the second lifecycle curve closely meets the discharging lifecycle curve, block S13 is implemented. If the first lifecycle curve does not closely meet the first predetermined critical life curve, or the second lifecycle curve does not closely meet the second predetermined critical life curve, block S03 to block S11 is implemented repeatedly till the first lifecycle curve closely meets the charging lifecycle curve, and the second lifecycle curve closely meets the discharging lifecycle curve.

In block S13, the report module 110 generates a lifecycle estimation report of the rechargeable battery 6 according to the comparison results, and displays the lifecycle estimation report on the display screen 14.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-implemented method, the method comprising:
   (a) controlling a power supply to charge a rechargeable battery under a first protection current, wherein the first protection current protects the power supply from damage during charging of the rechargeable battery;
   (b) controlling a test device to measure terminal voltages and rechargeable currents of the rechargeable battery when the rechargeable battery is charged, and obtaining a first plurality of terminal voltages and a first plurality of rechargeable currents of the rechargeable battery;
   (c) controlling the power supply to discharge the rechargeable battery under a second protection current, wherein the second protection current protects the power supply from damage during discharging of the rechargeable battery;
   (d) controlling the test device to measure terminal voltages and electronic currents of the rechargeable battery when the rechargeable battery is discharged, and obtaining a second plurality of terminal voltages and a second plurality of electronic currents of the rechargeable battery;
   (e) creating a first lifecycle curve based on the first terminal voltages and the first rechargeable currents, and creating a second lifecycle curve based on the second terminal voltages and the second electronic currents;
   (f) comparing the first lifecycle curve with a predetermined charge lifecycle curve, and comparing the second lifecycle curve with a predetermined discharge lifecycle curve; and
   (g) generating a lifecycle estimation report of the rechargeable battery according to the comparison results, and displaying the lifecycle estimation report on a display screen.

2. The computer-implemented method as described in claim 1, wherein the lifecycle estimation report indicates that the rechargeable battery has a long lifecycle upon the condition that the first lifecycle curve closely meets the charging lifecycle curve, and the second lifecycle curve closely meets the discharging lifecycle curve.

3. The computer-implemented method as described in claim 1, wherein the lifecycle estimation report indicates that the rechargeable battery has a short lifecycle upon the condition that the first lifecycle curve does not closely meet the charging lifecycle curve, or the second lifecycle curve does not closely meet the discharging life curve.

4. The computer-implemented method as described in claim 1, further comprising:
setting a first working parameter of the power supply in relation to charging of the rechargeable battery; and
setting a second working parameter of the power supply in relation to discharging of the rechargeable battery.

5. The computer-implemented method as described in claim 4, wherein the first working parameter comprises a charge time, measurement times for measuring the terminal voltages and the rechargeable currents of the rechargeable battery, a driving voltage, and a driving impedance.

6. The computer-implemented method as described in claim 4, wherein the second working parameter comprises a discharge time, measurement times for measuring the terminal voltages and the rechargeable currents of the rechargeable battery, a load voltage, and a load impedance.

7. A computing device, comprising:
at least one processor;
a storage system; and
one or more modules that are stored in the storage system and executed by the at least one processor, the one or more modules comprising:
a first measurement module operable to control a power supply to charge a rechargeable battery under a first protection current, control a test device to measure terminal voltages and rechargeable currents of a rechargeable battery when the rechargeable battery is charged by the power supply, and obtain a first plurality of terminal voltages and a first plurality of rechargeable currents of the rechargeable battery, wherein the first protection current protects the power supply from damage during charging of the rechargeable battery;
a second measurement module operable to control the power supply to discharge the rechargeable battery under a second protection current, control the test device to measure terminal voltages and electronic currents of the rechargeable battery when the rechargeable battery is discharged, and obtain a second plurality of terminal voltages and a second plurality of electronic currents of the rechargeable battery, wherein the second protection current protects the power supply from damage during discharging of the rechargeable battery;
a curve creation module operable to create a first lifecycle curve based on the first terminal voltages and the first rechargeable currents, and create a second lifecycle curve based on the second terminal voltages and the second electronic currents;
a lifecycle estimation module operable to compare the first lifecycle curve with a predetermined charge lifecycle curve, and compare the second lifecycle curve with a predetermined discharge lifecycle curve; and
a report module operable to generate a lifecycle estimation report of the rechargeable battery according to the comparison results, and display the lifecycle estimation report on a display screen of the computing device.

8. The computing device as described in claim 7, wherein the lifecycle estimation report indicates that the rechargeable battery has a long lifecycle upon the condition that the first lifecycle curve closely meets the charging lifecycle curve, and the second lifecycle curve closely meets the discharging lifecycle curve.

9. The computing device as described in claim 7, wherein the lifecycle estimation report indicates that the rechargeable battery has a short lifecycle upon the condition that the first lifecycle curve does not closely meet the charging lifecycle curve, or the second lifecycle curve does not closely meet the discharging life curve.

10. The computing device as described in claim 7, further comprising:
a setting module operable to set a first working parameter of the power supply in relation to charging of the rechargeable battery, and set a second working parameter of the power supply in relation to discharging of the rechargeable battery.

11. The computing device as described in claim 10, wherein the first working parameter comprises a charge time, measurement times for measuring the terminal voltages and the rechargeable currents of the rechargeable battery, a driving voltage, and a driving impedance.

12. The computing device as described in claim 10, wherein the second working parameter comprises a discharge time, measurement times for measuring the terminal voltages and the rechargeable currents of the rechargeable battery, a load voltage, and a load impedance.

13. A non-transitory storage medium having stored thereon instructions that, when executed by a processor of a computing device, causes the processor to perform a method for testing charging and discharging reliability of a rechargeable battery, the method comprising:
(a) controlling a power supply to charge a rechargeable battery under a first protection current, wherein the first protection current protects the power supply from damage during charging of the rechargeable battery;
(b) controlling a test device to measure terminal voltages and rechargeable currents of the rechargeable battery when the rechargeable battery is charged, and obtaining a first plurality of terminal voltages and a first plurality of rechargeable currents of the rechargeable battery;
(c) controlling the power supply to discharge the rechargeable battery under a second protection current, wherein the second protection current protects the power supply from damage during discharging of the rechargeable battery;
(d) controlling the test device to measure terminal voltages and electronic currents of the rechargeable battery when the rechargeable battery is discharged, and obtaining a second plurality of terminal voltages and a second plurality of electronic currents of the rechargeable battery;
(e) creating a first lifecycle curve based on the first terminal voltages and the first rechargeable currents, and creating a second lifecycle curve based on the second terminal voltages and the second electronic currents;
(f) comparing the first lifecycle curve with a predetermined charge lifecycle curve, and comparing the second lifecycle curve with a predetermined discharge lifecycle curve; and
(g) generating a lifecycle estimation report of the rechargeable battery according to the comparison results, and displaying the lifecycle estimation report on a display screen.

14. The non-transitory storage medium as described in claim 13, wherein the lifecycle estimation report indicates that the rechargeable battery has a long lifecycle upon the condition that the first lifecycle curve closely meets the charging lifecycle curve, and the second lifecycle curve closely meets the discharging lifecycle curve.

15. The non-transitory storage medium as described in claim 13, wherein the lifecycle estimation report indicates that the rechargeable battery has a short lifecycle upon the condition that the first lifecycle curve does not closely meet the charging lifecycle curve, or the second lifecycle curve does not closely meet the discharging life curve.

16. The non-transitory storage medium as described in claim 13, wherein the method further comprises:
    setting a first working parameter of the power supply in relation to charging of the rechargeable battery; and
    setting a second working parameter of the power supply in relation to discharging of the rechargeable battery.

17. The non-transitory storage medium as described in claim 16, wherein the first working parameter comprises a charge time, measurement times for measuring the terminal voltages and the rechargeable currents of the rechargeable battery, a driving voltage, and a driving impedance.

18. The non-transitory storage medium as described in claim 16, wherein the second working parameter comprises a discharge time, measurement times for measuring the terminal voltages and the rechargeable currents of the rechargeable battery, a load voltage, and a load impedance.

\* \* \* \* \*